(12) United States Patent
Younis et al.

(10) Patent No.: US 6,501,339 B1
(45) Date of Patent: Dec. 31, 2002

(54) RING OSCILLATORS WITH IMPROVED SIGNAL-PATH MATCHING FOR HIGH-SPEED DATA COMMUNICATIONS

(75) Inventors: Ahmed Younis, Austin, TX (US); Moises E. Robinson, Austin, TX (US); Michael A. Nix, Buds, TX (US); Brian T. Brunn, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/927,146

(22) Filed: Aug. 10, 2001

(51) Int. Cl.[7] .................................................. H03B 5/24
(52) U.S. Cl. .......................................... 331/57; 331/45
(58) Field of Search .............................. 331/57, 45, 46, 331/50

(56) References Cited

U.S. PATENT DOCUMENTS

| | | |
|---|---|---|
| 4,884,041 A | 11/1989 | Walker |
| 5,182,529 A * | 1/1993 | Chern ........................ 327/534 |
| 5,559,476 A * | 9/1996 | Zhang et al. ............... 327/278 |
| 5,592,126 A | 1/1997 | Boudewijns et al. |
| 5,592,127 A | 1/1997 | Mizuno |
| 5,594,391 A | 1/1997 | Yoshizawa |
| 5,841,325 A | 11/1998 | Knotts et al. |
| 6,005,448 A * | 12/1999 | Pickering et al. ........... 327/280 |
| 6,259,330 B1 | 7/2001 | Aria |
| 6,384,654 B1 * | 5/2002 | Noufer ........................ 326/80 |

* cited by examiner

Primary Examiner—Tuan T. Lam
Assistant Examiner—Cassandra Cox
(74) Attorney, Agent, or Firm—Eduardo E. Drake

(57) ABSTRACT

Electronic devices are typically coupled together to operate as systems that require the communication of data from one device to another. Many such devices include a ring oscillator, a circuit that generates one or more oscillating signals using a series of interconnected delay circuits. One problem with conventional ring oscillators concerns differences in the signal paths between the delay circuits. Accordingly, the present inventors devised several oscillators having unique layouts, which reduce differences in the signal paths between delay circuits. One exemplary oscillator includes a sequence of delay circuits having input-output connections between at least two pairs of non-adjacent delay circuits. Another exemplary oscillator provides two groups of delay circuits with a bus between the two groups, intercoupling the circuits. And, another exemplary oscillator arranges three or more delay circuits to form a closed loop. Applications for these oscillators include not only receivers, transmitters, and transceivers, but also programmable integrated circuits, electronic devices, and systems.

5 Claims, 7 Drawing Sheets

RING OSCILLATORS WITH IMPROVED SIGNAL-PATH MATCHING FOR HIGH-SPEED DATA COMMUNICATIONS

TECHNICAL FIELD

The present invention concerns data communications between electronic devices or circuits, particularly programmable phase-locked loops suitable for use in high-speed receivers, transmitters, and transceivers.

BACKGROUND

In the computer and telecommunications industries, many electronic devices are typically coupled together to operate as systems. In such systems, a common occurrence is the communication of data between two devices: a sending device and a receiving device.

The sending device generally has the data in the initial form of a set of digital words (sets of ones and zeros). In the sending device, a transmitter circuit converts each word into a sequence of electrical pulses, with each pulse timed according to a data clock, and transmits the timed sequence of pulses through a cable, circuit board, or other medium to the receiving device. The receiving device includes a receiver circuit that first determines the timing of the pulses and then identifies each of the pulses in the signal as a one or zero, enabling it to reconstruct the original digital words.

A key component in both the transmitter and the receiver is a voltage-controlled oscillator—a circuit that outputs a signal that varies back and forth between two voltage levels at a frequency based on an input control voltage. In the transmitter, a voltage-controlled oscillator controls timing of the pulses output by the transmitter, and in the receiver, it facilitates reconstruction of the digital words from the transmitted pulses.

Although there are several types of voltage-controlled oscillators, one type often used in serial data transmitters and receivers is the ring oscillator. Conventionally, the ring oscillator comprises a chain of delay circuits arranged in a straight line. Each delay circuit has an input coupled to an output of the preceding delay circuit, with the output of the last delay circuit in the line coupled to the input of the first delay circuit in the line to form a loop, or ring. All the delay circuits are coupled to a common control voltage which controls how much delay is applied to signals passing through them.

One problem the present inventors recognized with this conventional straight-line arrangement for ring oscillators is that the signal-path length (that is the length of the conductive path for a signal to travel) from the output of one delay circuit to the input of the next delay circuit, can vary significantly depending on the particular pair of delay circuits. For example, in a ten-circuit line, the signal path from the first delay circuit to the second delay circuit is roughly ten times shorter than the signal path from the tenth delay circuit in the line back to the first delay circuit. Thus, the effective delay of the tenth delay circuit is longer than that of the first delay circuit.

Although signal-path differences can be largely ignored for lower-frequency communications, they cannot at higher frequencies because the margin for timing error is much stricter. At higher data frequencies, the inconsistent delays stemming from signal-path differences undermine the ability of receiver circuits to reliably recover digital data from transmitted signals.

Accordingly, there is a need for ring oscillators that have better matched signal-path lengths.

SUMMARY

To address these and other needs, the present inventors devised several unique ring-oscillator layouts that provide improved matching of signal-path lengths. A first exemplary oscillator includes a group of at least four delay circuits arranged in a sequence, with each delay circuit having at least one adjacent delay circuit in the sequence and at least one non-adjacent delay circuit in the sequence. The exemplary oscillator further includes at least two input-output connections between non-adjacent delay circuits. In contrast, conventional ring oscillators have only one input-output connection between non-adjacent delay circuits—the connection between the first and the last delay circuits. The additional non-adjacent input-output connections tend to equalize or reduce the signal-path differences between the delay circuits, thereby improving oscillator performance, particularly at higher frequencies of oscillation.

A second exemplary ring oscillator includes a group of at least three delay circuits arranged to define a closed loop. Specifically, this exemplary embodiment includes a non-collinear (non-straight-line) arrangement of at least a first, a second, and a third delay circuit, with each having respective inputs and outputs. The output of the first is coupled to the input of the second; the output of the second is coupled to the input of the third; and the output of the third is coupled to the input of the first.

A third exemplary ring oscillator includes at least two groups of sequentially arranged delay circuits and a bus positioned between them. The bus includes one line for each of the delay circuits in the two groups, with each line coupled to an input of one of the delay circuits and an output of another delay circuit.

Other aspects of the invention include a phase-locked loop, receiver, transmitter, and transceiver that incorporate the exemplary ring oscillators. Still other aspects of the invention combine one or more of these components with programmable logic devices to define a system.

DETAILED DESCRIPTION OF EXEMPLARY EMBODIMENTS

The following detailed description, which references and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known in the art.

Figure 1:
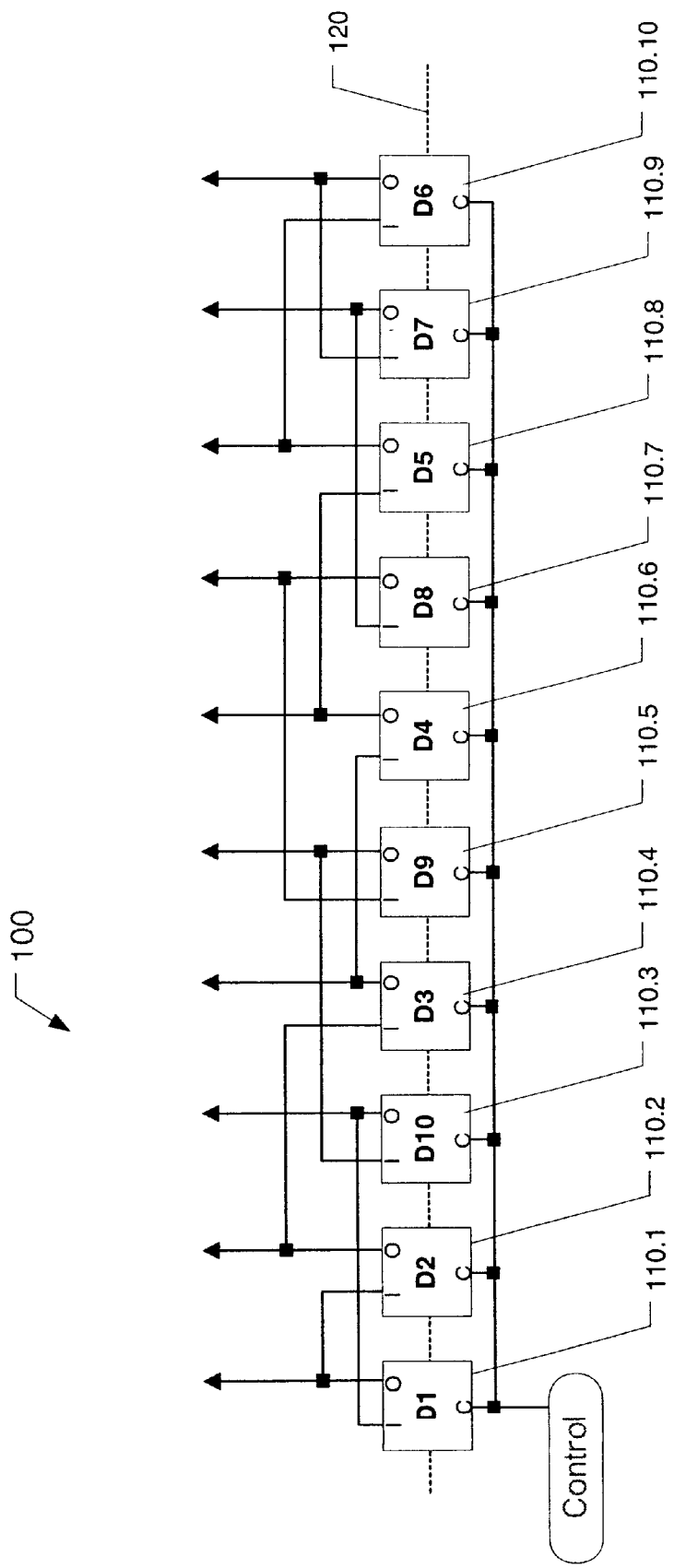
FIG. 1 is a block diagram of an exemplary ring oscillator 100 incorporating teachings of the invention.

FIG. 1 shows an exemplary ring oscillator 100 having a unique layout that incorporates teachings of the present invention. In particular, ring oscillator 100 includes ten substantially identical delay circuits, or cells, 110.1, 110.2, 110.3, 110.4, 110.5, 110.6, 110.7, 110.8, 110.9, 110.10 arranged sequentially or consecutively along a reference line 120. (Other embodiments arrange one or more delay circuits in non-alignment with the other delay circuits.) The suffix of each reference numeral denotes the ordinal line position of its associated delay circuit. For example, delay circuit 110.1 is first in line; delay circuit 110.2 is second in line; and delay circuit 110.10 is tenth in line.

Each delay circuit has a respective signal input I for receiving a periodic input signal, a signal output 0 for outputting a periodic signal delayed one delay period relative to the input signal, and a control input C for receiving a control voltage which has a substantial effect on the magnitude of the delay period. The exemplary delay circuits are shown with single-ended inputs, outputs, and control; however, the scope of the present invention also includes delay circuits with differential inputs, outputs, and/or control.

Each delay circuit also has an associated delay number representative of the total number of nominal delay periods that its output signal is delayed relative to an input signal of delay circuit 110.1—the first delay circuit. For example, delay circuit 110.2 has a delay number D2, indicating that it outputs a signal delayed two nominal delay periods relative to the input signal to delay circuit 110.1. Delay circuit 110.3 has a delay number D10, indicating that it outputs a signal delayed ten nominal delay periods relative to the input signal to delay circuit 110.1. (Although the input signal at delay circuit 110.1 is taken as the reference in this description, the input of any delay circuit could be taken as the reference, and the delay numbers could be adjusted accordingly.)

More precisely, FIG. 1 shows that the output of delay circuit 110.1 is coupled to the input of delay circuit 110.2, the next adjacent circuit along line 120. Circuit 110.2 has its output coupled to the input of circuit 110.4, a non-adjacent delay circuit. (As used herein, each delay circuit has at least one adjacent delay circuit, the one immediately preceding it in the straight-line sequence or the one immediately succeeding it; thus, a delay circuit that is a non-adjacent delay circuit is one that is not on either side of a given delay circuit.) Notably, circuit 110.4 has an associated delay number D3, but has a different ordinal number, namely 4, indicating its non-sequential placement along line 120.

The output of circuit 110.4 is coupled to the input of circuit 110.6, which has ordinal number 6 and delay number D4. Circuit 110.6 has its output coupled to the input of circuit 110.8. Circuit 110.8 has ordinal number 8, indicating its placement eighth (left to right) along line 120, and delay number D5, indicating that it outputs a signal delayed five nominal delay periods relative to the input of circuit 110.1. The output of circuit 110.8 is coupled to delay circuit 110.10, which has ordinal number 10 and delay number D6. Table 1 succinctly describes the complete set of interconnections among the signal inputs and outputs of the delay circuits in oscillator 100.

TABLE 1

Delay Circuit Connection List for FIG. 1

| DELAY CIRCUIT | ORDINAL NUMBER | DELAY NUMBER | INPUT CONNECTION | OUTPUT CONNECTION |
|---|---|---|---|---|
| 110.1 | 1 | 1 | 110.3 OUT | 110.2 IN |
| 110.2 | 2 | 2 | 110.1 OUT | 110.4 IN |
| 110.3 | 3 | 10 | 110.5 OUT | 110.1 IN |
| 110.4 | 4 | 3 | 110.2 OUT | 110.6 IN |
| 110.5 | 5 | 9 | 110.7 OUT | 110.3 IN |
| 110.6 | 6 | 4 | 110.4 OUT | 110.8 IN |
| 110.7 | 7 | 8 | 110.9 OUT | 110.5 IN |
| 110.8 | 8 | 5 | 110.6 OUT | 110.10 IN |
| 110.9 | 9 | 7 | 110.10 OUT | 110.7 IN |
| 110.10 | 10 | 6 | 110.8 OUT | 110.9 IN |

Unlike conventional straight-line arrangements for ring oscillators with the same number of delay circuits, oscillator 100 enjoys the advantage of having a much smaller range of signal-path lengths. Indeed, the smallest input-output signal-path length is zero and the longest is one, with the signal-length measured as the number of delay circuits between the output of one delay circuit to the input of the next delay circuit in the chain.

In one sense, oscillator 100 has the appearance of a conventional ten-element ring oscillator that is folded over on itself, with the fold line between the sixth and seventh elements. As illustrated in FIG. 1, this folding places the conventional seventh element (the element that has a delay number of seven) between the fifth and sixth elements, the eighth element between the fourth and fifth elements, the ninth element between the third and fourth elements, and the tenth element between the second and third elements. More succinctly, the folding yields the numerical sequence of delay numbers:

1--2--10--3--9--4--8--5--7--6, having a monotonically increasing sequence 1, 2, 3, 4, 5, 6 of delay numbers interleaved with a monotonically decreasing sequence 10, 9, 8, 7.

Note that folding a second time (that is, folding the 1--2--10 sequence) between the ninth and fourth delay circuits yields:

6--1--7--2--5--10--8--3--4--9, where the maximum signal-path length is three delay circuits. This suggests that the maximum signal-path length is always 2n-1, where n is the number of folds.

Other sequences of delay numbers are also possible depending on the direction of the fold and the chosen fold line. Thus, the invention as exemplified in oscillator 100 is presently believed to embrace any substantially straight-line arrangement of delay circuits having at least one delay circuit with a delay number different than its associated ordinal number.

Additionally, ring oscillators having various numbers of delay circuits can be reconfigured using teachings of the present invention to reduce signal-path disparities. Generalizing from the exemplary (single-fold) embodiment with ten delay circuits, one can interconnect virtually any ring oscillator having k delay circuits with corresponding ordinal numbers 1 through k such that each delay circuit has a delay number j, according to $$j = \begin{cases} \frac{i}{2} + 1, & \text{for even } i \\ 1 + \left[k - \left(\frac{i-1}{2}\right)\right] \bmod k, & \text{for odd } i \end{cases} \quad (1)$$

or $$j = \begin{cases} k - \left(\frac{i}{2} - 1\right), & \text{for even } i \\ \frac{i+1}{2}, & \text{for odd } i \end{cases} \quad (2)$$

where i denotes the ordinal number (or sequential position) of a given delay circuit and mod denotes the conventional modulus operator. (5 mod 4 is 1 and 5 mod 5 is 0.) For a k of 10, equation (1) yields the following sequential arrangement of delay numbers

1--2--10--3--9--4--8--5--7--6 and equation (2) yields 1--10--2--9--3--8--4--7--5--6
both of which are equivalent to the exemplary embodiment. For a k of 9, equation (1) yields

1--2--9--3--8--4--7--5--6 and equation (2) yields

1--9--2--8--3--7--4--6--5

It should also be appreciated that these sequences can be folded to obtain other sequences which, though generally less desirable in terms of equalized or matched signal paths, would also provide an improvement over conventional ring oscillators.

Figure 2:
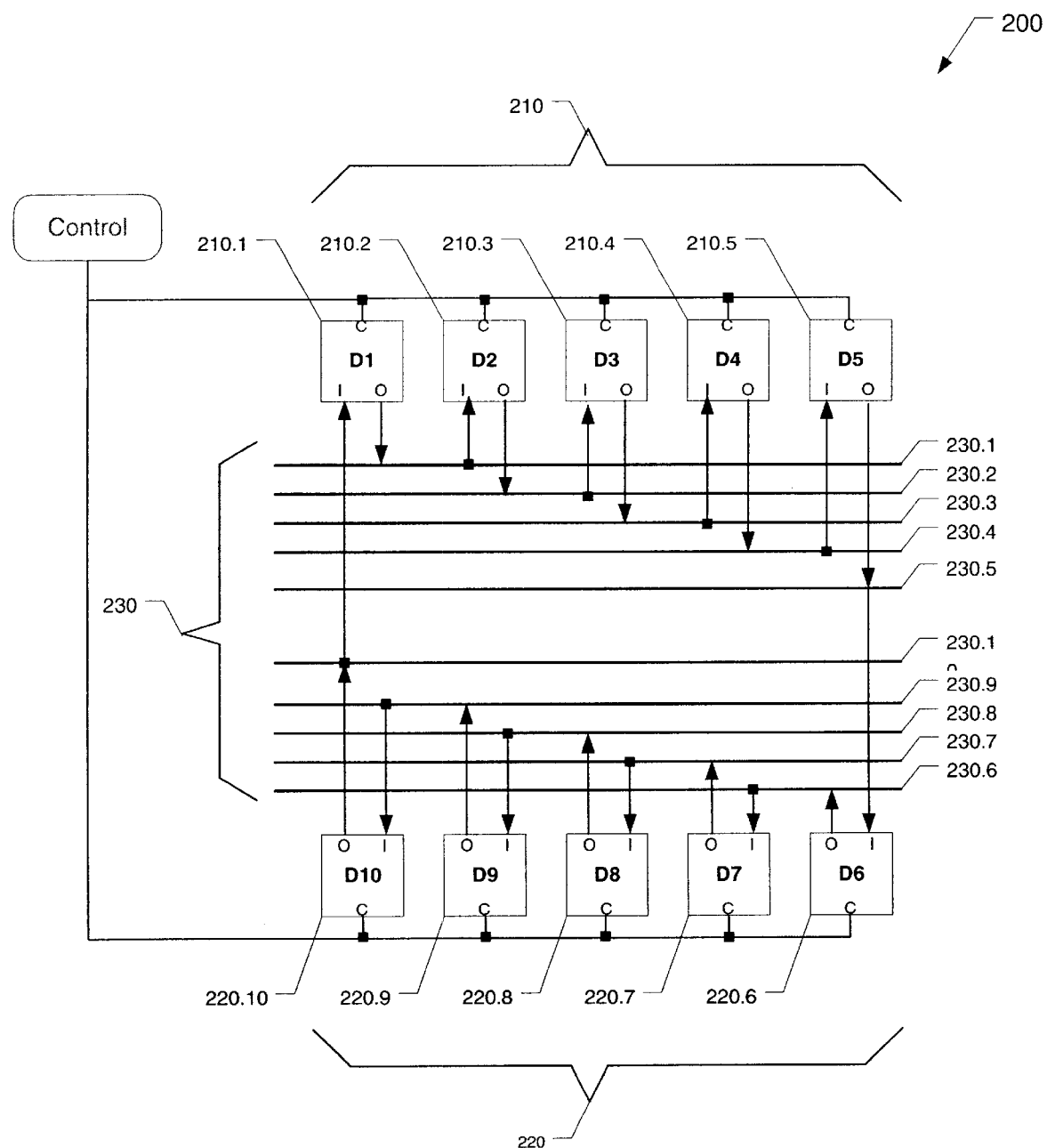
FIG. 2 is a block diagram of an exemplary ring oscillator 200 incorporating teachings of the invention.

FIG. 2 shows a second exemplary 10-circuit ring oscillator 200. Oscillator 200 includes a group 210 of five delay circuits, a group 220 of five delay circuits, and a ten-line bus 230 between the first and second groups.

More particularly, group 210 includes delay circuits 210.1, 210.2, 210.3, 210.4 and 210.5, and group 220 includes delay circuits 220.6, 220.7, 220.8, 220.9, and 220.10, with the suffixes 1–10 indicating the respective ordinal numbers and delay numbers of the associated delay circuits with respect to the entire arrangement of 10 delay circuits, which are substantially identical. Each of the delay circuits has a respective signal input I for receiving a periodic input signal, a signal output O for outputting a periodic signal delayed one delay period relative to the input signal, and a control input C for receiving a control signal that controls the magnitude of the delay period. FIG. 2 shows the delay circuits with single-ended inputs and outputs; however, the scope of the present invention also includes delay circuits with differential inputs, outputs, and/or controls.

Placed between groups 210 and 220 is ten-line bus 230. Bus 230 includes substantially parallel and equi-spaced bus lines 230.1, 230.2, 230.3, 230.4, 230.5, 230.6, 230.7, 230.8, 230.9, and 230.10. Each bus line is coupled to the output of the delay circuit having the same suffix, and to the input of the delay circuit having the next suffix in the sequence. For example, bus line 230.1 is coupled to the output of delay circuit 210.1 and the input of delay circuit 210.2; bus line 230.2 is coupled to the output of delay circuit 210.2 and the input of delay circuit 210.3; and bus line 230.3 is coupled to the output of delay circuit 210.3 and the input of delay circuit 210.4. Table 2 succinctly describes the interconnection of the bus lines and the delay circuits.

TABLE 2

Delay Circuit Connection List for FIG. 2

| DELAY Circuit | ORDINAL NUMBER | DELAY NUMBER | INPUT CONNECTION | OUTPUT CONNECTION |
|---|---|---|---|---|
| 210.1 | 1 | 1 | bus line 230.10 | bus line 230.1 |
| 210.2 | 2 | 2 | bus line 230.1 | bus line 230.2 |
| 210.3 | 3 | 3 | bus line 230.2 | bus line 230.3 |
| 210.4 | 4 | 4 | bus line 230.3 | bus line 230.4 |
| 210.5 | 5 | 5 | bus line 230.4 | bus line 230.5 |
| 220.6 | 6 | 6 | bus line 230.5 | bus line 230.6 |
| 220.7 | 7 | 7 | bus line 230.6 | bus line 230.7 |
| 220.8 | 8 | 8 | bus line 230.7 | bus line 230.8 |
| 220.9 | 9 | 9 | bus line 230.8 | bus line 230.9 |
| 220.10 | 10 | 10 | bus line 230.9 | bus line 230.10 |

In some embodiments, the delay circuits in groups 210 and 220 are implemented within one horizontal region of an integrated circuit, and bus 230 is implemented on another horizontal level above or below, but still between the delay circuits. However, in other integrated-circuit embodiments, the bus is implemented on the same level as the metallization for the delay circuits or with portions on different levels relative to other portions of the bus and/or the delay circuits. Additionally, some other embodiments also provide different and/or unequal numbers of delay circuit groupings.

Figure 3:
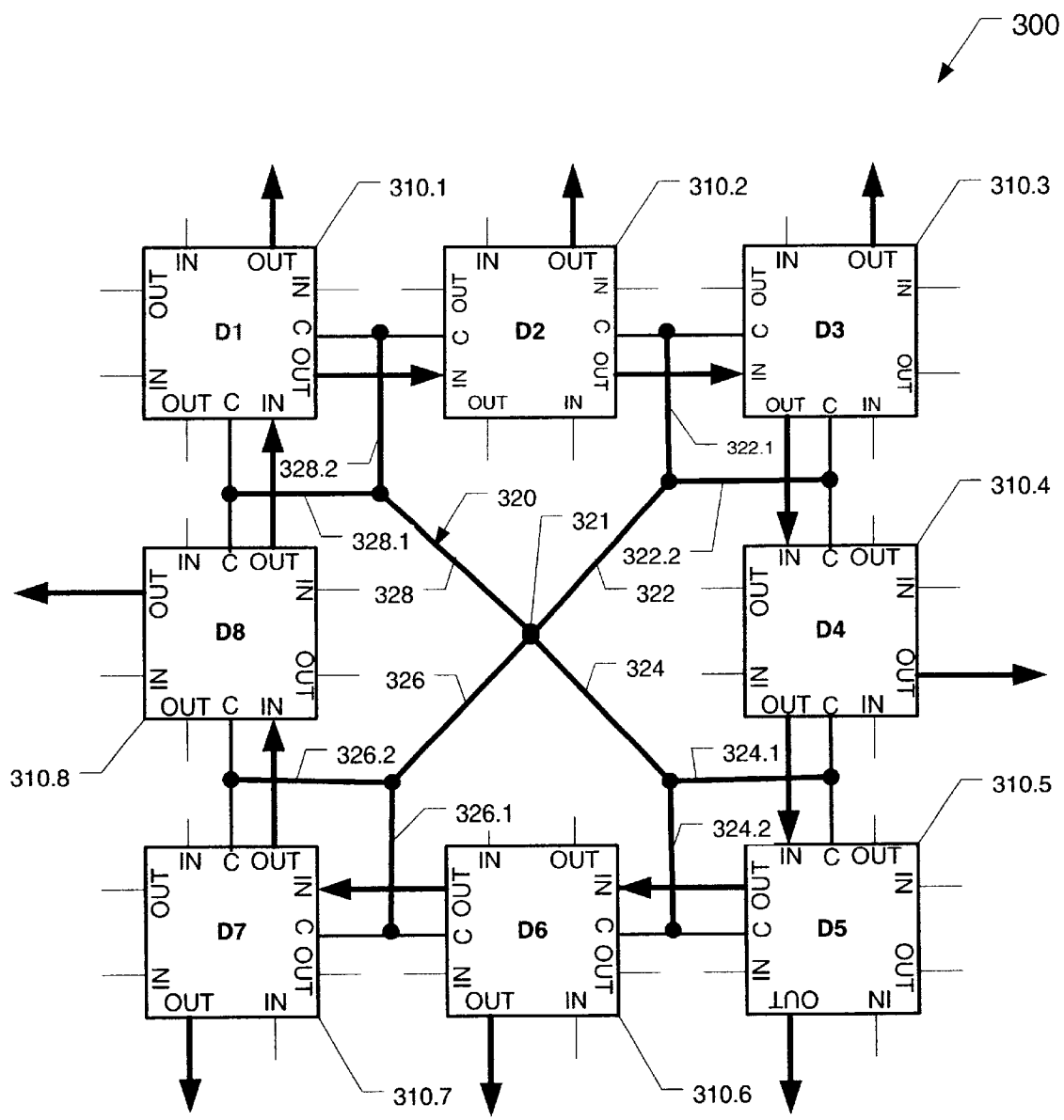
FIG. 3 is a block diagram of an exemplary ring oscillator 300 incorporating teachings of the invention.

FIG. 3 shows an exemplary oscillator 300 also incorporating teachings of the present invention. Oscillator 300 includes eight substantially identical delay circuits 310.1–310.8, and a central control distribution network 320. (Other embodiments of the invention couple the output of each delay circuit to a buffer circuit, which drives other on-chip or off-chip circuitry.)

Delay circuits 310 are arranged in a closed-loop formation. In this example, each of the delay circuits has four sides, with each side having a signal input I for receiving a periodic input signal and a signal output O for outputting a periodic signal delayed one delay period relative to the input signal. Also, each delay circuit includes a control input C on each side that confronts another delay circuit. The control input receives a signal that controls the magnitude of the delay period. (FIG. 3 shows single-ended inputs and outputs; however, the scope of the present invention also includes delay circuits with differential inputs, outputs, and/or control.)

The output of delay circuit 310.1 is coupled to the adjacent input of delay circuit 310.2, which has its output coupled to the adjacent input of delay circuit 310.3. Delay circuit 310.3 has its output coupled to the adjacent input of delay circuit 310.4 which has its output coupled to the adjacent input of delay circuit 310.5; delay circuit 310.5 has its output coupled to the adjacent input of delay circuit 310.6 which has its output coupled to the adjacent input of delay circuit 310.7; delay circuit 310.7 has its output coupled to the adjacent input of delay circuit 310.8, which has its output coupled to the adjacent input of delay circuit 310.1.

Control distribution network 320 has a central node 321 and four branches 322, 324, 326, and 328. Central node 321—placed, for example, on metallization level with, above, or below the delay circuits—receives a control signal for setting the delay of each of the delay circuits. Central node 321 is coupled to the control inputs (or nodes) of each the delay circuits via substantially equi-length branches 322–328.

More precisely, branch 322, which includes sub-branches 322.1 and 322.2, couples node 321 to the control inputs of delay circuits 310.2, 310.3, and 310.4. Branch 324, which includes sub-branches 324.1 and 324.2, couples node 321 to the control inputs of delay circuits 310.4, 310.5, and 310.6. Branch 326, which includes sub-branches 326.1 and 326.2, couples node 321 to the control inputs of delay circuits 310.6, 310.7, and 310.8. Branch 328, which includes sub-branches 328.1 and 328.2, couples node 321 to the control inputs of delay circuits 310.8, 310.1, and 310.2.

Notably, the closed-loop arrangement of its constituent delay circuits provides oscillator 300 with a consistent zero signal-path length (measured as the number of delay circuits between the output of a delay circuit and the input of the next delay circuit in the loop chain.) In contrast, conventional straight-line arrangements for eight delay circuits would provide a range of signal-path lengths extending from zero to seven, again with the signal-path measured as the number of delay circuits between the output of one delay circuit to the input of the next delay circuit in the loop chain. Additionally, the central control distribution network provides more consistent loading of the control signal input from delay circuit to delay circuit in the oscillator, further enhancing the matching characteristics of the delay circuits.

Exemplary Transmitter

Figure 4:
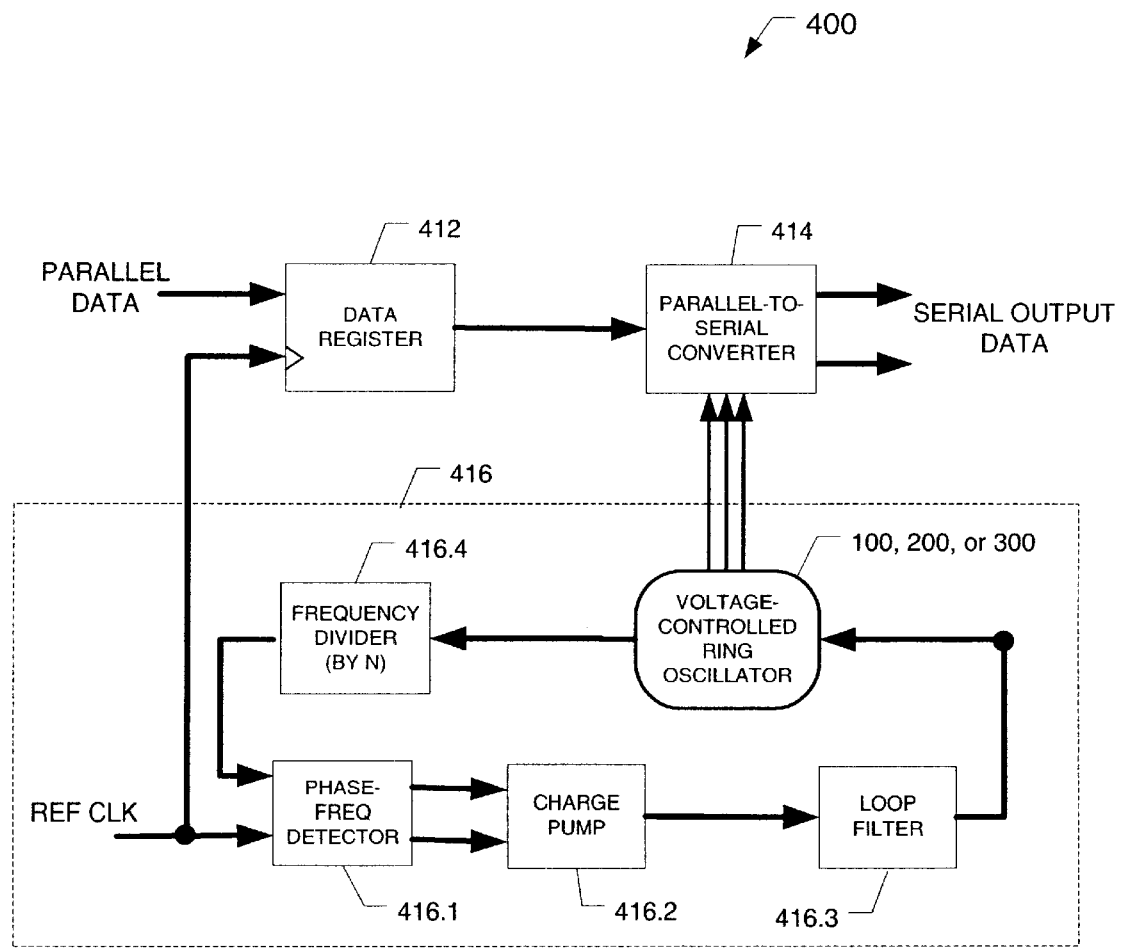
FIG. 4 is a block diagram of an exemplary transmitter 400 incorporating ring oscillator 100, 200, or 300.

FIG. 4 shows an exemplary transmitter 400 that incorporates exemplary oscillator 100, 200, or 300 of FIGS. 1–3. In particular, transmitter 400, which operates according to conventional principles, includes a data register 412 and a parallel-to-serial converter 414, and a phase-locked loop 416. In addition to ring oscillator 100, 200, or 300, phase-locked loop 416 includes a phase-frequency detector 416.1, a charge pump 416.2, a loop filter 416.3, and a frequency divider 416.4.

Exemplary Receiver

Figure 5:
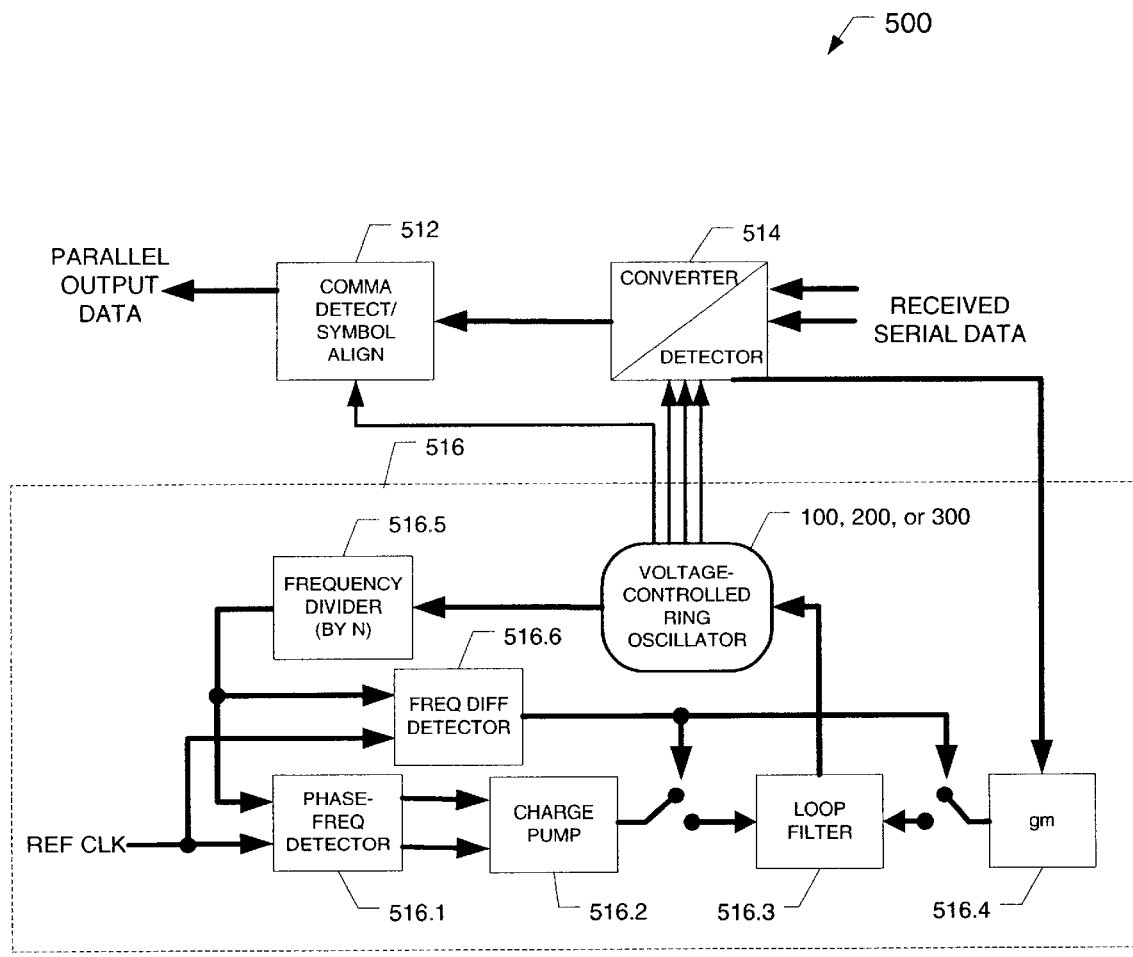
FIG. 5 is a block diagram of an exemplary receiver 500 incorporating ring oscillator 100, 200, or 300.

FIG. 5 shows an exemplary receiver 500 that incorporates exemplary oscillator 100, 200, or 300 of FIGS. 1–3. In particular, receiver 500, which operates according to conventional principles, includes a comma-detection-and-symbol-alignment module 512 and a serial-to-parallel-converter-and-phase-detector module 514, and a phase-locked loop 516. In addition to ring oscillator 100, 200, or 300, phase-locked loop 516 includes a phase-frequency detector 516.1, a charge pump 516.2, a loop filter 516.3, a variable transconductance (gm) 516.4, a frequency divider 516.5, and a frequency-difference detector 516.6.

Exemplary Field Programmable Integrated Circuit

Figure 6:
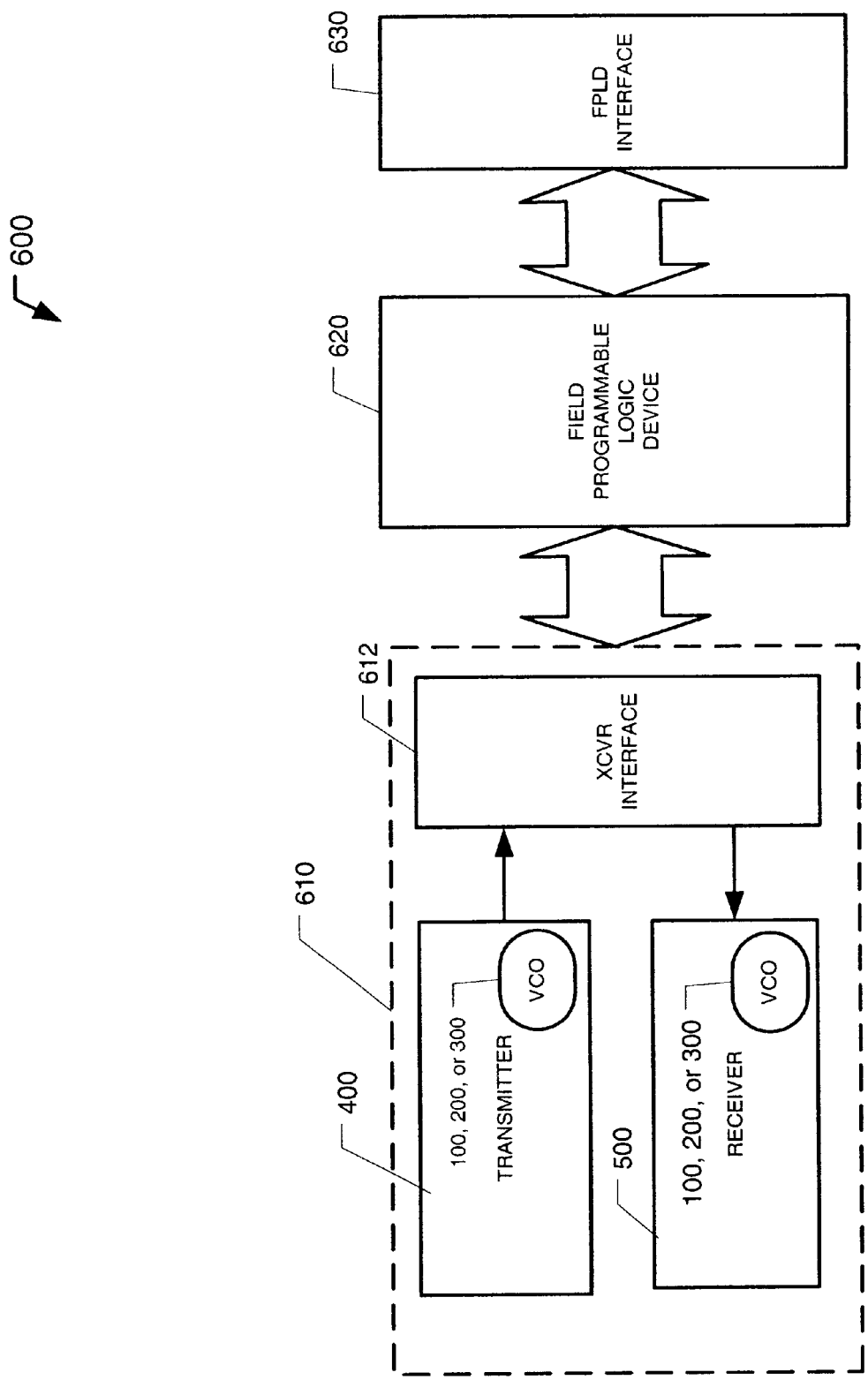
FIG. 6 is a block diagram of an exemplary programmable integrated circuit 600 incorporating transmitter 400 and receiver 500.

FIG. 6 shows a block diagram of an exemplary field-programmable integrated circuit 600, which includes an exemplary transceiver 610, a field-programmable logic device (FPLD) 620, such as a field-programmable gate array (FPGA), and an FPLD interface 630. Transceiver 610 includes transmitter 400 of FIG. 4, receiver 500 of FIG. 5, and a transceiver (XCVR) interface 612. Transmitter 400 and receiver 500 both include voltage-controlled oscillator 100, 200, or 300. Transceiver interface 612 facilitates communications between transceiver 612 and field-programmable logic device 620.

Although not shown in the Figure, various embodiments of logic device 620 includes one or more individually and collectively configurable logic blocks, as well as an on-board processor and memory, which facilitate configuration of the device to perform desirable signal and data processing functions. FPLD Interface 630 provides conventional communications and program-support capabilities.

Exemplary System

Figure 7:
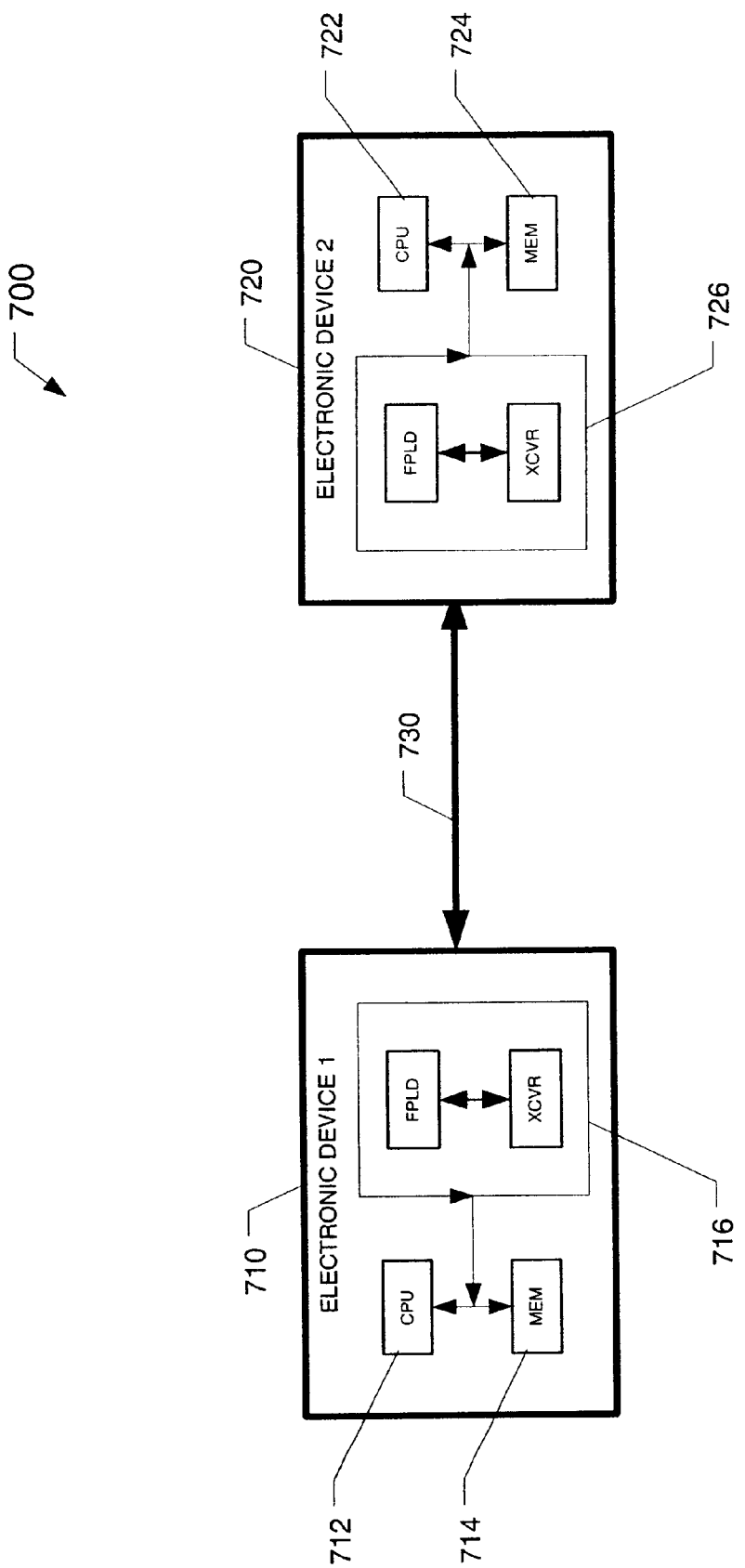
FIG. 7 is a block diagram of an exemplary system 700 incorporating programmable integrated circuits 716 and 726, both of which follow the example of integrated circuit 600.

FIG. 7 shows an exemplary system 700 including two or more electronic devices that incorporate field-programmable integrated circuit 600 of FIG. 6. In particular, system 700 includes electronic devices 710 and 720 and a communications link 730. Devices 710 and 720 include respective processors 712 and 722, memories 714 and 724, and integrated programmable logic circuits 716 and 726. Circuits 716 and 726 incorporate the teachings of exemplary circuit 600 in FIG. 6 and thus provide devices 710 and 720 with capability for communicating data over communications link 730, such as a cable, circuit board, or other medium, to each other.

Devices 710 and 720 can assume a wide variety of forms. For example, in various embodiments, one or both of the devices are a computer, monitor, mouse, keyboard, printer, scanner, fax machine, network communications device, personal digital assistant, cordless telephone, headset, mobile telephone, vehicle, appliance, entertainment equipment, and industrial controller. Indeed, virtually any device that currently communicates with another device or would benefit from such communications could incorporate teachings of the present invention.

Conclusion

In furtherance of the art, the inventors have presented several unique ring-oscillator layouts and applications for oscillators incorporating these layouts. One exemplary oscillator includes a sequential arrangement of delay circuits, with at least one of the delay circuits having an ordinal number different from its associated delay number, or with at least two input-output connections between non-adjacent delay circuits. Another exemplary oscillator provides two groups of delay circuits with a bus between the two groups intercoupling the circuits. And, another exemplary oscillator arranges three or more delay circuits to form a closed loop. Exemplary applications for these oscillators include not only receivers, transmitters, and transceivers, but also programmable integrated circuits, electronic devices, and systems.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. A ring oscillator comprising:

a sequence of delay circuits including at least first and second pairs of non-adjacent delay circuits, with each pair of non-adjacent delay circuits having at least one delay circuit between them and with each delay circuit in the sequence having an input for receiving an input signal and an output for driving a delayed version of the input signal into the input of only one other delay circuit in the sequence; and a first input-output connection between the first pair of non-adjacent delay circuits; and a second input-output connection between the second pair of non-adjacent delay circuits.

2. The ring oscillator of claim 1, wherein the delay circuits are substantially identical circuits arranged in a line.

3. The ring oscillator of claim 1, wherein each delay circuit is a differential delay circuit having at least one control input for adjusting the nominal delay, with the control input for each delay circuits coupled to receive a common control signal.

4. The ring oscillator of claim 1, wherein each delay circuit has an adjustable delay.

5. The ring oscillator of claim 1, wherein each of the delay circuits are substantially identical.

* * * * *